US006583400B2

United States Patent
Miyoshi (10) Patent No.: US 6,583,400 B2
(45) Date of Patent: Jun. 24, 2003

(54) MULTICHANNEL RECEIVER CIRCUIT FOR PARALLEL RECEPTION

(75) Inventor: Kazunori Miyoshi, Tokyo (JP)

(73) Assignee: NEC Corporation, Tokyo (JP)

( * ) Notice: Subject to any disclaimer, the term of this patent is extended or adjusted under 35 U.S.C. 154(b) by 56 days.

(21) Appl. No.: 09/984,812

(22) Filed: Oct. 31, 2001

(65) Prior Publication Data

US 2002/0050558 A1 May 2, 2002

(30) Foreign Application Priority Data

Nov. 1, 2000 (JP) ........................................ 2000-334484

(51) Int. Cl.[7] ............................ H01J 40/14; H03K 5/08; H04B 10/06; H04B 1/10
(52) U.S. Cl. .................. 250/214 A; 327/319; 327/321; 359/189; 330/124 R; 455/303; 250/214 DC
(58) Field of Search ................ 250/214 A, 214 LA, 250/214 R, 214 C, 214 DC; 359/189–195; 327/319, 320; 330/124 R, 295, 307, 310; 455/132, 303

(56) References Cited

U.S. PATENT DOCUMENTS 5,191,462 A  *  3/1993 Gitlin et al.
5,214,527 A  *  5/1993 Chang et al.
5,578,399 A  * 11/1996 Takai et al.
6,307,660 B1 * 10/2001 Cordell et al.

* cited by examiner

Primary Examiner—David Porta
Assistant Examiner—David C Meyer
(74) Attorney, Agent, or Firm—McGinn & Gibb, PLLC (57) ABSTRACT

A multichannel receiver circuit is provided, which suppresses effectively crosstalk or interference between the electric signals transmitted in parallel through multiple channels at high speed and which improves the S/N for each channel. The receiver circuit comprises first to n-th sections for forming respectively first to n-th channels, where n is an integer greater than unity. The first to n-th sections receive first to n-th electric input signals to produce first to n-th electric output signals, respectively, where each of the first to n-th output signals having different logic levels according to a corresponding one of the first to n-th input signals. Each of the first to n-th sections includes an output level fixer circuit that produces an output signal. The output signal of the output level fixer circuit having a fixed level that induces no oscillation when a corresponding one of the first to n-th input signals has a level less than a specific reference level. The output signal of the output level fixer circuit has substantially a same waveform as that of a corresponding one of the first to n-th input signals when a corresponding one of the first to a-th input signals has a level equal to or greater than the specific reference level. The level fixer circuit may be formed by a multilevel retainer circuit or a Schmitt trigger circuit.

11 Claims, 9 Drawing Sheets

MULTICHANNEL RECEIVER CIRCUIT FOR PARALLEL RECEPTION

BACKGROUND OF THE INVENTION

1. Field of the Invention

The present invention relates to a multichannel receiver circuit that suppresses effectively crosstalk (signal interference) between the channels. More particularly, the invention relates to a multichannel receiver circuit for receiving in parallel electrical input signals to produce electrical output signals by way of respective channels, in which each of the output signals has two different logic levels, such as logic high (H) and low (L) levels, according to the level of a corresponding one of the input signals.

2. Description of the Related Art

In recent years, with the development and advance of communications technology, there is the growing need to transmit data at a possibly high speed not only in trunk lines but also in or between communication devices (e.g., transmission terminals and exchanges), or computers. In the high-speed transmission systems of this type, the "parallel transmission" technique has been used, in which a high-speed signal is divided into rather low-speed signals and then, they are transmitted in parallel by way of multiple channels. "Multichannel receiver circuits" are used for receiving and amplifying these rather low-speed signals in parallel through multiple channels.

With the multichannel receiver circuits of this type, an electric input signal with a relatively small amplitude is typically amplified by a built-in amplifier circuit to thereby produce an electric output signal with a relatively large amplitude in each channel. In this case, usually, the amplification factor of the amplifier circuit is considerably large.

Figure 1:
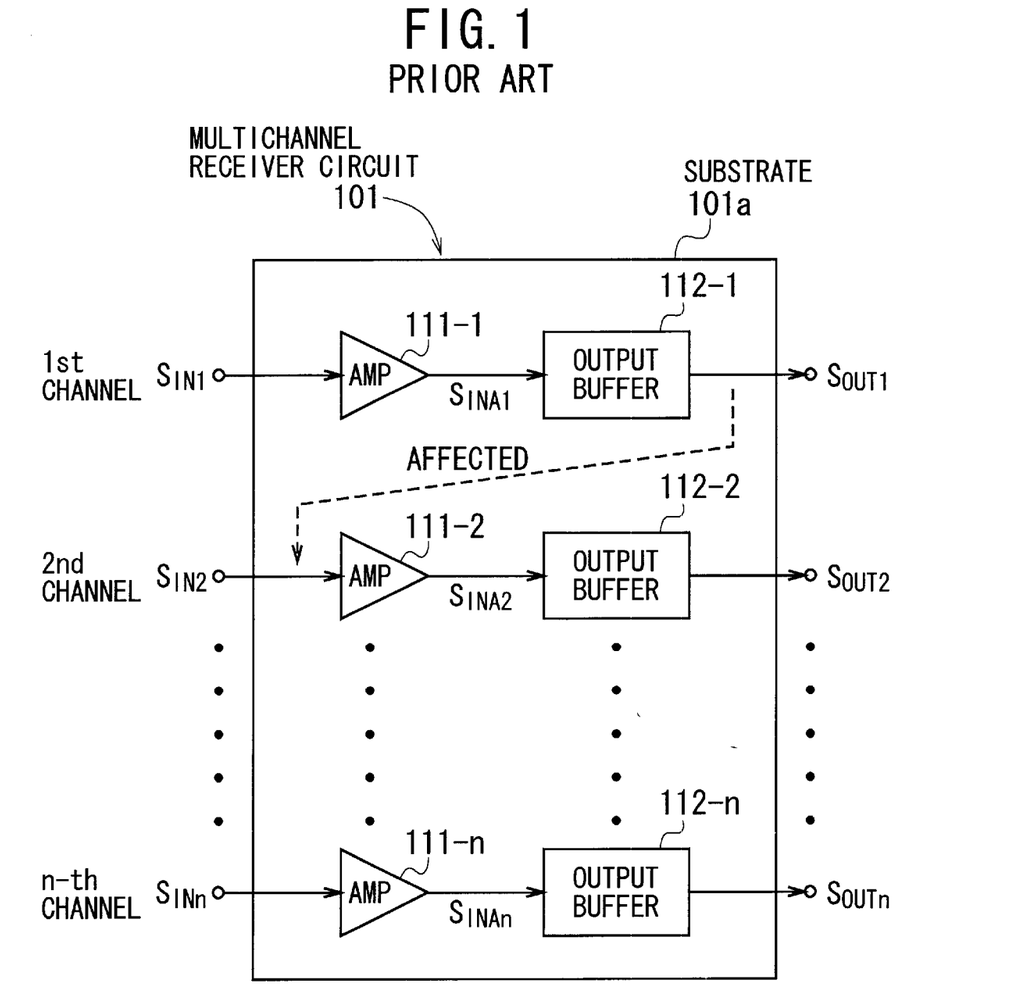
FIG. 1 is a functional block diagram showing the configuration of a prior-art multichannel receiver circuit.

FIG. 1 schematically shows the configuration of an example of the prior-art multichannel receiver circuits of this type. The receiver circuit 101 in FIG. 1 is formed and integrated on a semiconductor substrate 101a in the form of an Integrated Circuit (IC). The receiver circuit 101 comprises first to n-th sections with the same circuit configuration that constitute respectively the first to n-th channels, where n is an integer greater than unity.

In the first section for the first channel, an amplifier circuit 111-1 and an output buffer circuit 112-1 are provided. The amplifier circuit 111-1 receives a first input signal $S_{IN1}$ through the first input terminal of the receiver circuit 101 and produces a first amplified input signal $S_{INA1}$. The output buffer circuit 112-1 receives the first amplified input signal $S_{INA1}$ from the circuit 111-1 and produces a first output signal $S_{OUT1}$ at the first output terminal of the circuit 101.

In the second section for the second channel, an amplifier circuit 111-2 and an output buffer circuit 112-2 are provided. The amplifier circuit 112-2 receives a second input signal $S_{IN2}$ through the second input terminal of the receiver circuit 101 and produces a second amplified input signal $S_{INA2}$. The output buffer circuit 112-2 receives the second amplified input signal $S_{INA2}$ from the circuit 111-2 and produces a second output signal $S_{OUT2}$ through the second output terminal of the circuit 101.

Similarly, in the n-th section for the n-th channel, an amplifier circuit 111-n and an output buffer circuit 112-n are provided. The amplifier circuit 111-n receives a n-th input signal $S_{INn}$ through the n-th input terminal of the receiver circuit 101 and produces a n-th amplified input signal $S_{INAn}$. The output buffer circuit 112-n receives the n-th amplified input signal $S_{INAn}$ from the circuit 111-n and produces a n-th output signal $S_{OUTn}$ at the n-th output terminal of the circuit 101.

Although not shown in FIG. 1 and described here, each of the third to (n-1)-th sections for the third to (n-1)-th channels has the same configuration and operation as the first, second, and n-th sections.

With the prior-art multichannel receiver circuit 101 shown in FIG. 1, the first to n-th sections for the first to n-th channels are formed and integrated on the semiconductor substrate 101a in the form of an IC. Thus, there is a disadvantage that a signal transmitted through one of the first to n-th channels is likely to be affected by another transmitted through an adjoining one or ones of these channels.

On the other hand, all of the first to n-th channels are not always used, in other words, there is a possibility that one or more channels is/are kept unused. Moreover, input of at least one of the first to n-th input signals may be stopped due to some fault such as transmission line disconnection. In these cases, the output signal of an unused channel or a channel having no input signal application is undefined (i.e., the channel in question is in the "don't care" state) and as a result, the said channel will enter its oscillation state that causes a noise with a large amplitude.

Figure 2:
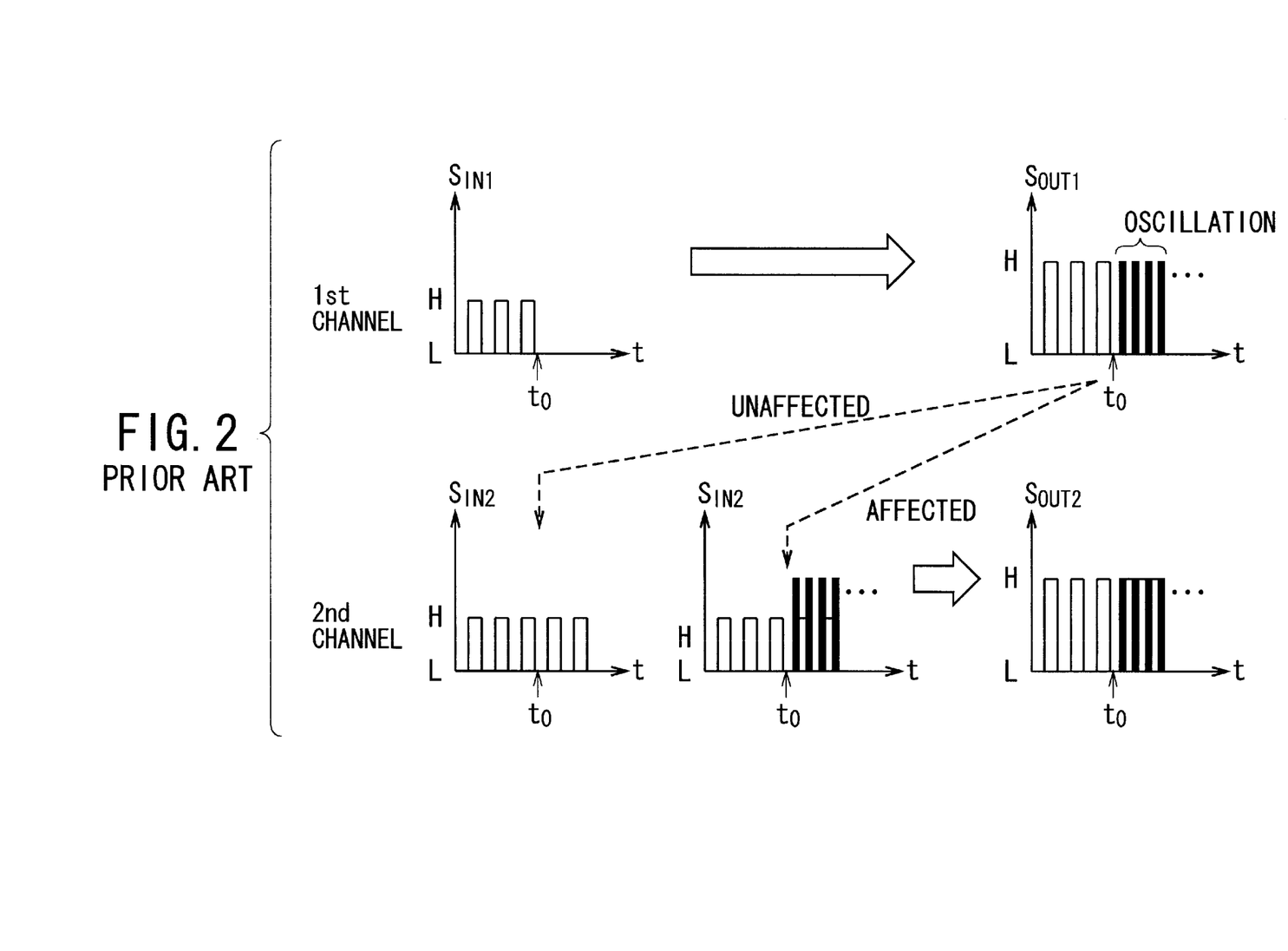
FIG. 2 is a schematic illustration showing the change of state of the input and output signals for the first and second channels of the prior-art multichannel receiver circuit of FIG. 1.

For example, as shown in FIG. 2, it is supposed that input of the first input signal $S_{IN1}$ for the first channel is suddenly stopped at the time to due to line disconnection while the second to n-th input signal $S_{IN2}$ to $S_{INn}$ for the rest of the channels are being inputted. In this case, the level of the first input signal is zero and thus, the first output signal $S_{OUT1}$ enters its oscillation state and generates a pulsed noise in the first channel. The noise thus generated in the first channel tends to affect the nearest second input signal $S_{IN2}$ by way of the substrate 101a or the IC package (not shown) at and after the disconnection time to. Thus, at and after the time to, there is a possibility that the second input signal $S_{IN2}$ includes a pulsed noise with a large amplitude. If so, the second output signal $S_{OUT2}$ includes a pulsed noise due to the noise of the second input signal $S_{IN2}$, which degrades the signal to noise ratio (S/N) of the signal $S_{OUT2}$ in the second channel.

There is a possibility that some of the third to n-th output signals $S_{OUT3}$ to $S_{OUTn}$ include a pulsed noise due to the noise induced in the first channel.

Conventionally, since electric signals transmitted in parallel through multiple channels in the multichannel receiver circuit of this type have narrow bandwidths, the above-described disadvantage has occurred scarcely. In recent years, however, these receiver circuits have been highly integrated on a semiconductor substrate monolithically and at the same time, the signal speed for each channel has increased further. As a result, the above-described disadvantage of S/N degradation due to crosstalk has been becoming conspicuous.

With the prior-art multichannel receiver circuit 101 of FIG. 1, when one of the input signals $S_{IN1}$ to $S_{INn}$ of the first to n-th channels does not exist due to some cause, the said input signal enters its oscillation state and then, a pulsed noise with large amplitude is generated therein. The pulsed noise thus produced tends to affect the input side of the adjoining channel or channels (i.e., crosstalk occurs) by way of the substrate 101a or the IC package. Thus, a pulsed noise occurs in the input signal for the adjoining channel. This means that not only the input signal of the adjoining channel but also the noise thereof are amplified and outputted as the output signal $S_{OUT1}$ to $S_{OUTn}$, resulting in S/N degradation due to crosstalk. This event becomes more conspicuous and serious as the signal speed increases.

SUMMARY OF THE INVENTION

Accordingly, an object of the present invention is to provide a multichannel receiver circuit that suppresses effectively crosstalk or interference between the electric signals transmitted in parallel through multiple channels at high speed.

Another object of the present invention is to provide a multichannel receiver circuit that prevents the generation of oscillation state for each channel.

Still another object of the present invention is to provide a multichannel receiver circuit that improves the S/N for each channel.

The above objects together with others not specifically mentioned will become clear to those skilled in the art from the following description.

A multichannel receiver circuit according to the invention comprises:

first to n-th sections for forming respectively first to n-th channels, where n is an integer greater than unity;

the first to n-th sections receiving first to n-th electric input signals to produce first to n-th electric output signals, respectively, where each of the first to n-th output signals having different logic levels according to a corresponding one of the first to n-th input signals;

each of the first to n-th sections including an output level fixer circuit that produces an output signal;

the output signal of the output level fixer circuit having a fixed level that induces no oscillation when a corresponding one of the first to n-th input signals has a level less than a specific reference level; and the output signal of the output level fixer circuit having substantially a same waveform as that of a corresponding one of the first to n-th input signals when a corresponding one of the first to n-th input signals has a level equal to or greater than the specific reference level.

With the multichannel receiver circuit according to the invention, each of the first to n-th sections for forming respectively the first to n-th channels includes the level fixer circuit. The output signal of the output level fixer circuit has substantially a same waveform as that of a corresponding one of the first to n-th input signals when a corresponding one of the first to n-th input signals has a level equal to or greater than the specific reference level. Therefore, in this state, the function of the level fixer circuit is to pass a corresponding one of the first to n-th input signals through itself without substantially changing its waveform.

On the other hand, the output signal of the level fixer circuit has a fixed level that induces no oscillation when a corresponding one of the first to n-th input signals has a level less than the specific reference level. Therefore, even if one of the first to n-th channels is subjected to disappear of its input signal due to nonuse or line disconnection or the like and then, a corresponding one of the first to n-th input signals has a level less than the specific reference level, no oscillation occurs in the said channel. In other words, the channel is not turned into an undefined state, or it does not enter the "don't care" state, because of the operation of the level fixer circuit.

Accordingly, no crosstalk or interference occurs between adjoining ones of the first to n-th channels, which improves the S/N of the signal for each channel.

In a preferred embodiment of the circuit according to the invention, each of the first to n-th sections includes an amplifier circuit located prior to the level fixer circuit. An amplified input signal of the amplifier circuit is inputted into the level fixer circuit of a corresponding one of the first to n-th sections. In this embodiment, there is an additional advantage that the advantages of the invention are more conspicuous.

In another preferred embodiment of the circuit according to the invention, the level fixer circuit has an input-output characteristic with a hysteresis. Preferably, the hysteresis has a changeable width.

In this embodiment, preferably, the fixed level of the output signal of the level fixer circuit is equal to a logic L level or a logic H level. Alternately, the level-fixed output signal produced by the output level fixer circuit may be equal to an intermediate level between the logic L level and the logic H level.

In still another preferred embodiment of the circuit according to the invention, if the output signal of the level fixer circuit is in a logic L level at a time when a corresponding one of the first to n-th input signals has a level less than a specific reference level, the fixed level of the output signal of the level fixer circuit is equal to the logic L level. If the output signal of the level fixer circuit is in a logic H level at the said time, the fixed level of the output signal of the level fixer circuit is equal to the logic H level.

In a further preferred embodiment of the circuit according to the invention, the level fixer circuit is formed by a multilevel retainer circuit. The output signal of the multilevel retainer circuit has at least two different values for the logic L or H level. One of the at least two different values is selectively used.

In a still further preferred embodiment of the circuit according to the invention, the level fixer circuit is formed by a Schmitt trigger circuit.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described in detail below while referring to the drawings attached.

Figure 3:
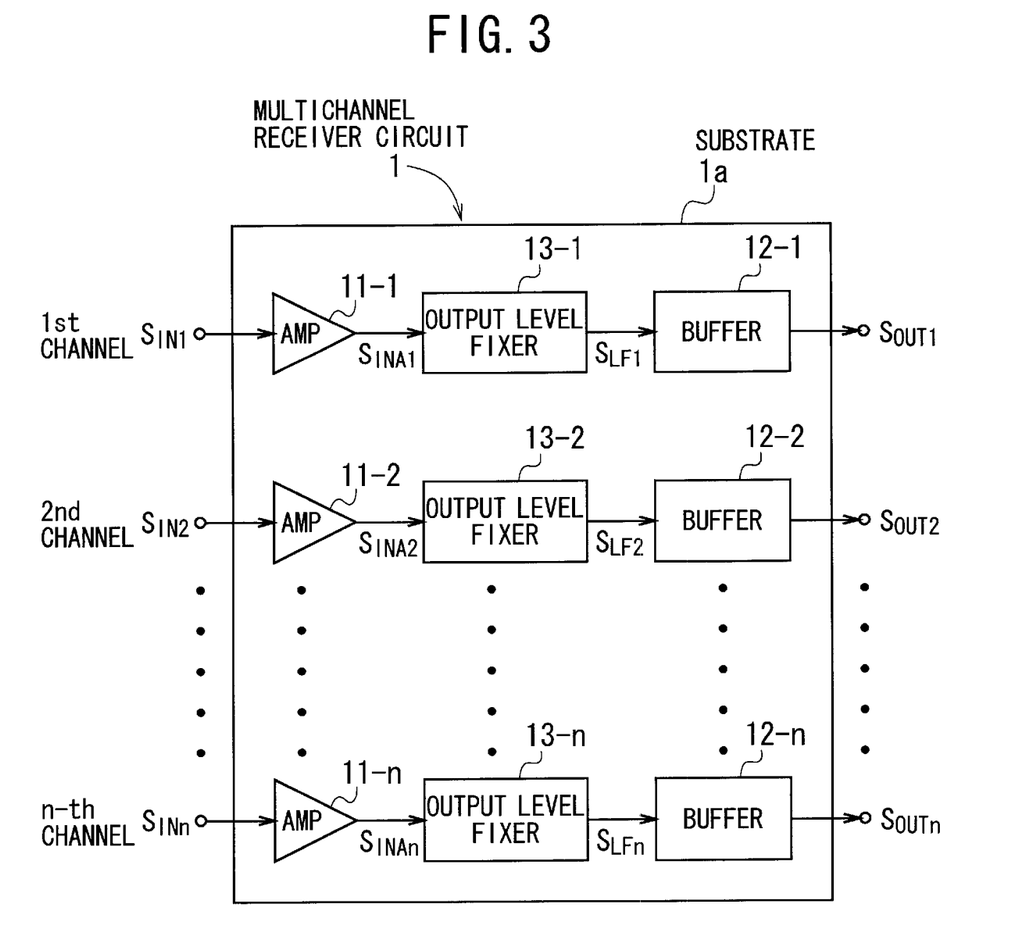
FIG. 3 is a functional block diagram showing the configuration of a multichannel receiver circuit according to the invention, in which output level fixer circuits are used.

A multichannel receiver circuit 1 according to the invention has the configuration as shown in FIG. 3, which is formed and integrated on a semiconductor substrate 1a in the form of an IC. The receiver circuit 1 comprises first to n-th sections with the same circuit configuration that constitute respectively the first to n-th channels.

It is needless to say that the receiver circuit 1 includes practically any other circuits. However, they are omitted in FIG. 3, because they have no relationship with the invention.

In the first section for the first channel, an amplifier circuit 11-1, a buffer circuit 12-1, and an output level fixer circuit 13-1 are provided. The output level fixer circuit 13-1 is located between the amplifier circuit 11-1 and the buffer circuit 12-1. The amplifier circuit 11-1 receives a first input signal $S_{IN1}$ through the first input terminal of the receiver circuit 1 and produces a first amplified input signal $S_{INA1}$. The output level fixer circuit 13-1 receives the first amplified input signal $S_{INA1}$ from the circuit 11-1 and produces an output signal $S_{LF1}$. The buffer circuit 12-1 receives the output signal $S_{LF1}$ from the circuit 13-1 and stores it temporarily, and output it as a first output signal $S_{OUTn}$ through the first output terminal of the circuit 1.

In the second section for the second channel, an amplifier circuit 11-2, a buffer circuit 12-2, and an output level fixer circuit 13-2 are provided. The output level fixer circuit 13-2 is located between the amplifier circuit 11-2 and the buffer circuit 12-2. The amplifier circuit 11-2 receives a second input signal $S_{IN2}$ through the second input terminal of the receiver circuit 1 and produces a second amplified input signal $S_{INA2}$. The output level fixer circuit 13-2 receives the second amplified input signal $S_{INA1}$ from the circuit 11-2 and produces an output signal $S_{LF2}$. The buffer circuit 12-2 receives the output signal $S_{LF2}$ from the circuit 13-2 and stores them temporarily, and output it as a second output signal $S_{OUT2}$ through the second output terminal of the circuit 1.

Similarly, in the n-th section for the n-th channel, an amplifier circuit 11-n, a buffer circuit 12-n, and an output level fixer circuit 13-n are provided. The output level fixer circuit 13-n is located between the amplifier circuit 11-n and the buffer circuit 12-n. The amplifier circuit 11-n receives a n-th input signal $S_{INn}$ through the n-th input terminal of the receiver circuit 1 and produces a n-th amplified input signal $S_{INAn}$. The output level fixer circuit 13-n receives the n-th amplified input signal $S_{INAn}$ from the circuit 11-n and produces a n-th output signal $S_{LFn}$. The buffer circuit 12-n receives the n-th output signal $S_{LFn}$ from the circuit 13-n and stores them temporarily, and output it as a n-th output signal $S_{OUTn}$ through the n-th output terminal of the buffer circuit 1.

Although not shown in FIG. 3 and described here, each of the third to (n-1)-th sections for the third to (n-1)-th channels has the same configuration and operation as the first, second, and n-th sections.

Thus, the receiver circuit 1 receives the first to n-th input signals $S_{IN1}$ to $S_{INn}$ in parallel, amplifies them, fixing their levels at specific levels if necessary, stores temporarily them, and outputs them as the first to n-th output signals $S_{OUT1}$ to $S_{OUTn}$ in parallel, by way of the first to n-th channels. Each of the first to n-th input signals $S_{IN1}$ to $S_{INn}$ is a pulsed signal. Each of the first to n-th output signals $S_{OUT1}$ to $S_{OUTn}$ is a pulsed signal as well.

Concretely, each of the amplifier circuits 11-1 to 11-n is formed by, for example, the combination of a preamplifier and a main amplifier connected in series.

As seen from the above description, each of the first to n-th output level fixer circuits 13-1 to 13-n is connected in series to a corresponding one of the first to n-th amplifier circuits 11-1 to 11-n and a corresponding one of the first to n-th buffer circuits 12-1 to 12-n.

Each of the circuits 13-1 to 13-n has the same configuration and function as each other. Therefore, the circuit 13-1 for the first channel is mainly explained below with reference to FIG. 4.

Figure 11:
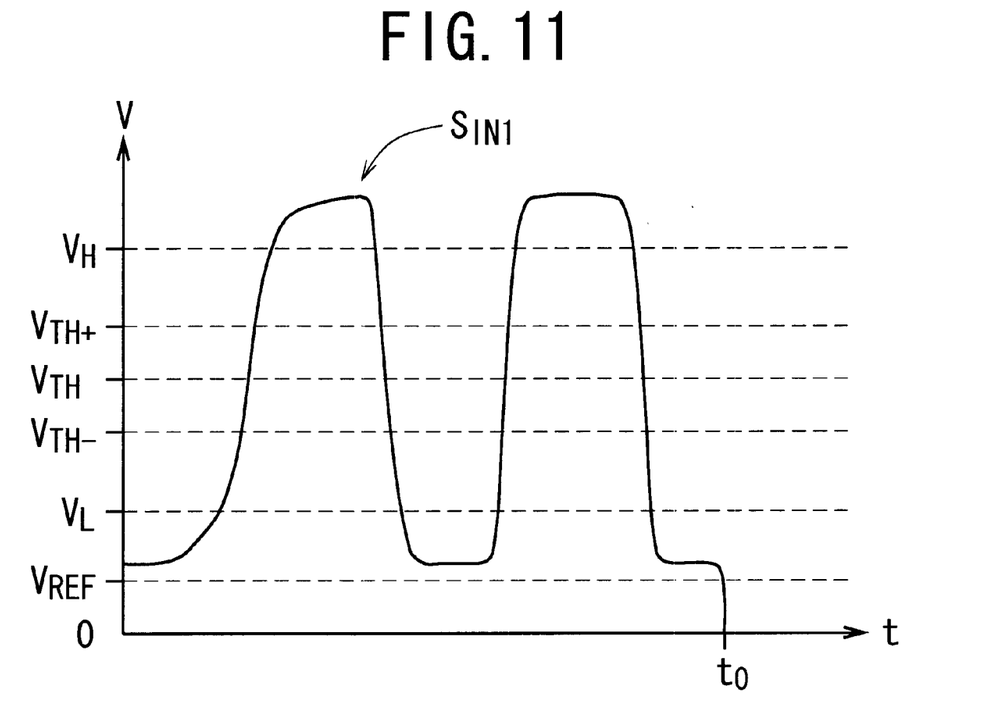
FIG. 11 is a schematic illustration showing the change of the first input signal $S_{IN1}$ for the first channel in the multichannel receiver circuit according to the invention of FIG. 3.

The output level fixer circuit 13-1 for the first channel receives the first amplified input signal $S_{INA1}$. As shown in FIG. 11, the signal $S_{INA1}$ is a pulsed signal with the logic H level (i.e., voltage $V_H$) and the logic L level (i.e., voltage $V_L$), where $V_H > V_L > 0$. A reference voltage $V_{REF}$ is defined to be lower than the logic L voltage $H_L$.

When the first input signal $S_{IN1}$ has a level less than the reference level (i.e., the reference voltage $V_{REF}$), the output signal $S_{LF1}$ of the first output level fixer circuit 13-1 is fixed at the logic L level (i.e., voltage $V_L$) or the logic H level (i.e., voltage $V_H$). Since both the voltages $V_L$ and $V_H$ are greater than 0, no oscillation occurs in the first channel even if the first channel is unused or is applied with no input due to some failure (e.g., transmission line disconnection). As a result, no crosstalk or interference occurs between the first channel and the adjoining second channel. This leads to improvement of the S/N of the signal for each channel.

When the first input signal $S_{IN1}$ has a level equal to or greater than the reference level (i.e., the reference voltage $V_{REF}$), the output signal $S_{LF1}$ of the first output level fixer circuit 13-1 has substantially the same waveform as that of the first input signal $S_{IN1}$. Thus, in this case, the function of the level fixer circuit 13-1 is to pass the first input signal $S_{IN1}$ through itself without substantially changing its waveform.

Next, the operation of the receiver circuit 1 of the invention is explained below in detail with reference to FIG. 4.

It is supposed that transmission line disconnection occurs and the level or amplitude of the first input signal $S_{IN1}$ in the first channel is turned to zero (i.e., 0 V) at the time to.

Prior to the disconnection time to, the first input signal $S_{IN1}$ in the first channel is normal, in which the signal $S_{IN1}$ is formed by repeated rectangular pulses having the logic H level (i.e., the higher voltage $V_H$) and the logic L level (i.e., the lower voltage $V_L$), where $V_H > V_L > 0$.

Figure 4:
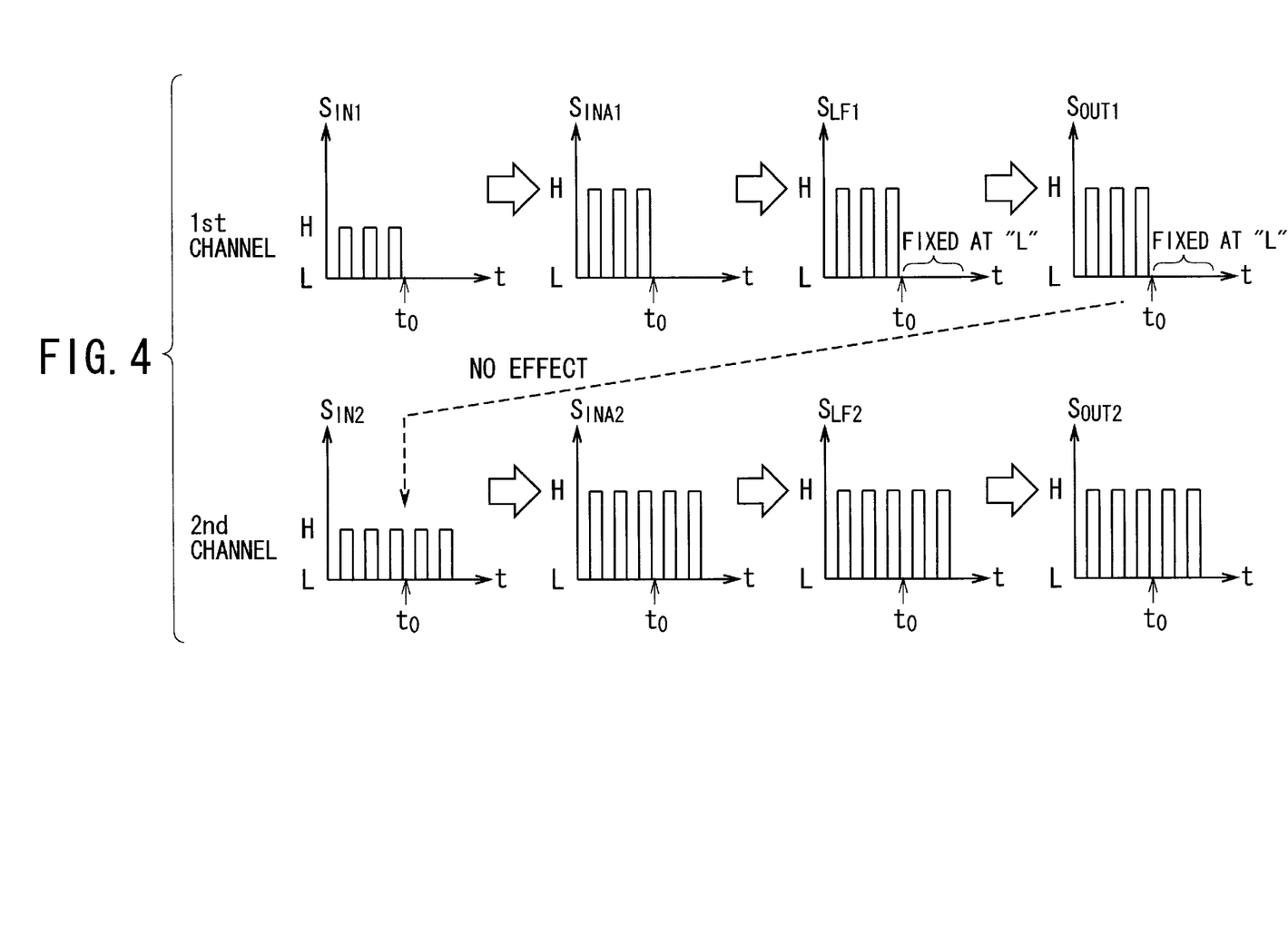
FIG. 4 is a schematic illustration showing the change of state of the input and output signals for the first and second channels of the multichannel receiver circuit according to the invention of FIG. 3.

As seen from FIG. 4, the level of the first input signal $S_{IN1}$ is turned to zero (not to $V_L$) at the disconnection time to, where the signal $S_{IN1}$ is to be in the logic L level.

Since the first amplified input signal $S_{INA1}$ is the output of the first amplifier circuit 11-1, it is formed by the same repeated pulses as the first input signal $S_{IN1}$ except that the level or amplitude of the signal SINA is increased.

Since the first input signal $S_{IN1}$ (the first amplified input signal $S_{INA1}$ as well) is normal, the level of the signal $S_{INA1}$ changes between the logic high and low voltages $V_H$ and $V_L$ greater than the reference voltage $V_{REF}$. Therefore, the output signal $S_{LF1}$ of the output level fixer circuit 13-1 has substantially the same waveform as the first amplified input signal $S_{INA1}$ received.

The buffer circuit 12-1 receives the output signal $S_{LF1}$ from the output level fixer circuit 13-1, stores it temporarily, and outputs it as the first output signal $S_{OUT1}$.

Accordingly, the pulses of the first input signal $S_{IN1}$ in the first channel are amplified and then, outputted through the first output terminal of the receiver circuit 1 before the disconnection time $t_0$. This is applied to the second input signal $S_{IN2}$ for the second channel.

At the disconnection time $t_0$ and later, the level of the first input signal $S_{IN1}$ is turned to zero (i.e., approximately 0 V) and kept in the same state, which is lower than the reference voltage $V_L$. Therefore, the level of the amplified input signal $S_{INA1}$ from the amplifier 11-1 is turned to zero and kept in the same state as well. In response to this event, the output signal $S_{LF1}$ of the circuit 13-1 is kept at the logic L state (i.e., at the voltage $V_L$). As a result, the first output signal $S_{OUT1}$ is fixed at the logic L state (i.e., at the voltage $V_L$) as well.

Accordingly, with the multichannel receiver circuit 1 of the invention of FIG. 3, even if line disconnection occurs in the first channel, the first output signal $S_{OUT1}$ is promptly kept at the logic L state or the voltage $V_L$ and is never turned to be zero. Therefore, no oscillation state will occur in the first channel and thus, no crosstalk or interference between the first channel and the adjoining second channel occurs due to oscillation in the first channel by way of the substrate 1$a$ or the IC package. This means that the first input signal $S_{IN1}$ in the first channel does not affect the second input signal $S_{IN2}$ in the second channel. This prevents degradation of S/N for the second channel and improves the same.

Needless to say, since the line disconnection in the first channel gives no effect to the third to n-th channels, the overall S/N of the receiver circuit 1 can be improved.

Figure 9:
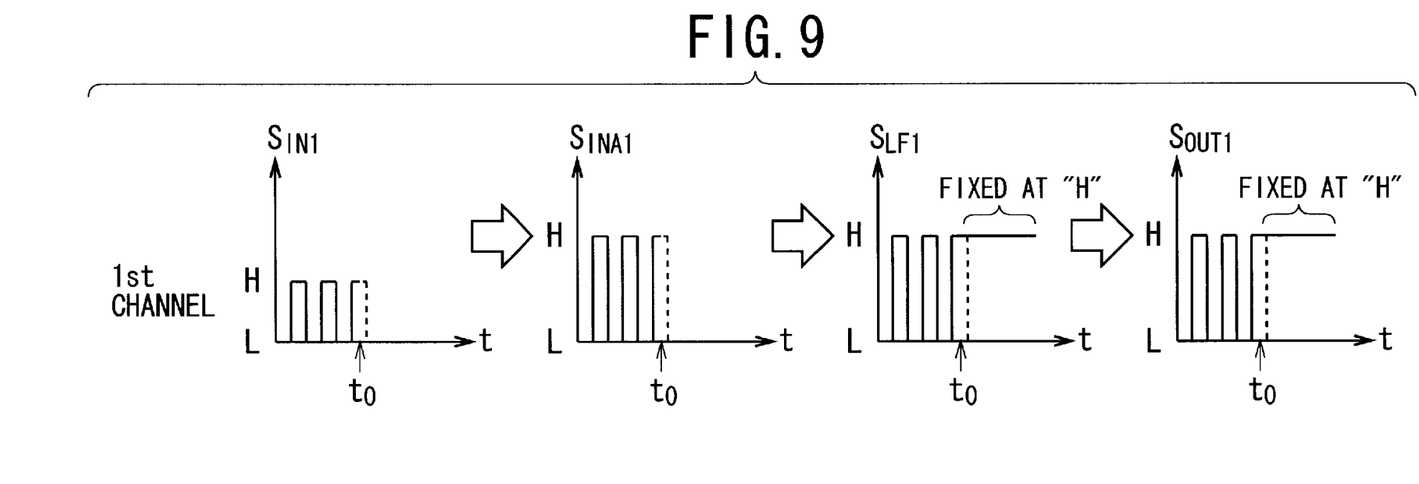
FIG. 9 is a schematic illustration showing the change of state of the input and output signals for the first channel in the multichannel receiver circuit according to the invention of FIG. 3.

FIG. 9 shows the change of pulses of the signals $S_{IN1}$, $S_{INA1}$, $S_{LF1}$, and $S_{OUT1}$ in the first channel in the multichannel receiver circuit 1 according to the invention.

In the above-described explanation with reference to FIG. 4, the disconnection time to is located in the period of time where the first input signal $S_{IN1}$ is in the logic L state. Therefore, the output signal $V_{LF1}$ of the level fixer circuit 13-1 is fixed at the logic L state (i.e., at the voltage $V_L$). In FIG. 9, unlike this, the disconnection time to is located in the period of time where the first input signal $S_{IN1}$ is in the logic H state. In this case, the first amplified input signal $S_{IN1}$ is kept at the logic H state at the time to and later. In response to this, the output signal $S_{LF1}$ of the level fixer circuit 13-1 is fixed at the logic H state (i.e., at the voltage $V_H$). As a result, in this case, the first output signal $S_{OUT1}$ is fixed at the logic H state (i.e., at the voltage $V_H$) at the time to and later, as shown in FIG. 9.

Additionally, in the above-described explanation with reference to FIGS. 4 and 9, the fixed level of the output signal $S_{ILF1}$ is changed between $V_H$ and $V_L$ dependent on the fact that the disconnection time to belongs to which logic state of the first input signal $S_{IN1}$. However, the invention is not limited to this case. For example, the fixed level of the signal $S_{ILF1}$ may be defined at $V_H$ or $V_L$ regardless of the fact that the disconnection time to belongs to which logic state of the first input signal $S_{IN1}$.

Figure 10:
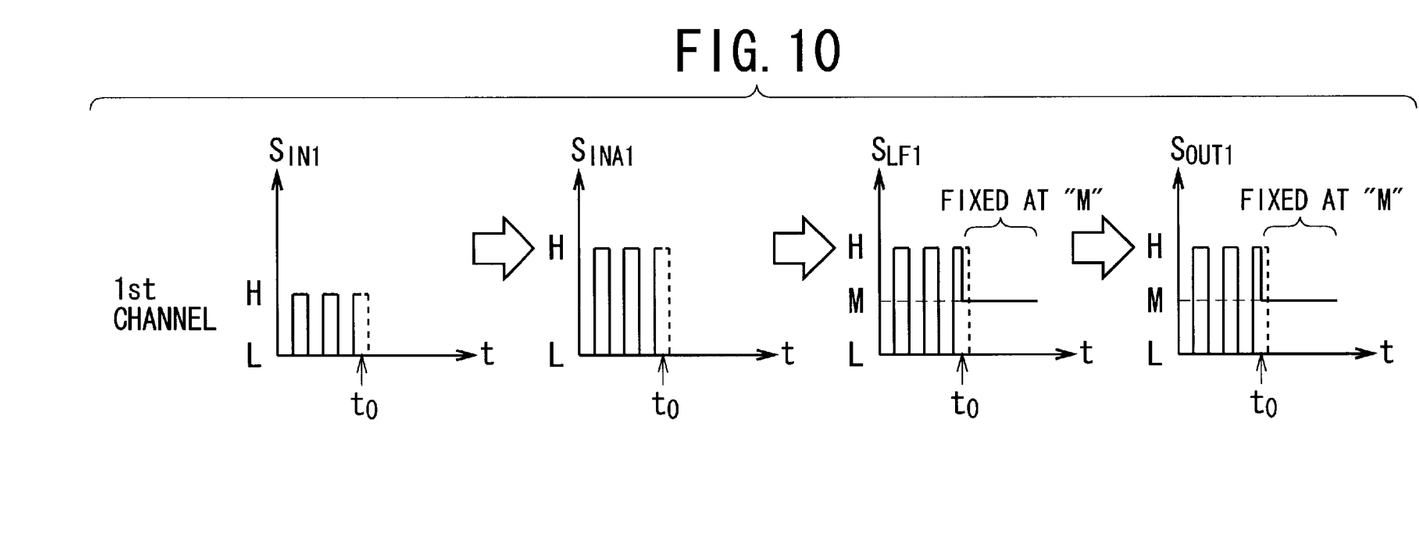
FIG. 10 is a schematic illustration showing the change of state of the input and output signals for the first channel in a variation of the multichannel receiver circuit according to the invention of FIG. 3.

Moreover, the fixed level of the first level-fixed signal $S_{ILF1}$ may be defined at any other level or levels than $V_H$ and $V_L$. For example, as shown in FIG. 10 the fixed level of the first level-fixed signal $S_{ILF1}$ may be defined at an intermediate level M between the logic H and L levels. The intermediate level M needs to be lower or higher than the threshold voltage $V_{TH}$ for the first input signal $S_{IN1}$ (see FIG. 11).

It is preferred that the reference level (i.e., the reference voltage $V_{REF}$) is changeable in each of the first to n-th output level fixer circuit 13-1 to 13-$n$. This can be easily realized by known technique and thus, no explanation about it is presented here. In this case, there is an additional advantage that the level-fixing operation of the output signals $S_{LF1}$ to $S_{LFn}$ of the circuits 13-1 to 13-$n$ is ensured. This is because the value of the reference voltage $V_{REF}$ can be adjusted in response to the voltage value to be left in the channels when some failure or non-use occurs.

First Embodiment

Figure 5:
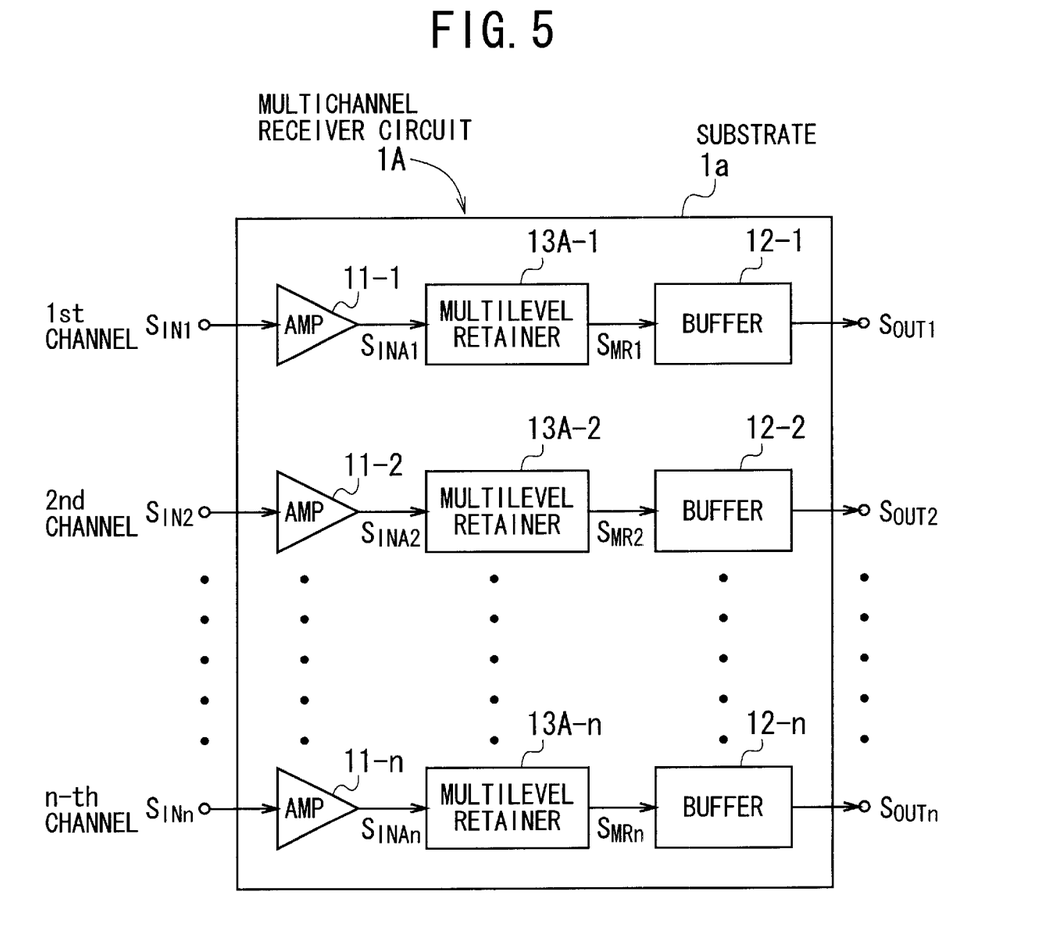
FIG. 5 is a functional block diagram showing the configuration of a multichannel receiver circuit according to a first embodiment of the invention, in which multilevel retainer circuits are used as the output level fixer circuits.

FIG. 5 shows the configuration of a multichannel receiver circuit 1A according to a first embodiment of the invention, which corresponds to a concrete example of the receiver circuit 1 shown in FIG. 3.

As shown in FIG. 5, first to n-th multilevel retainer circuits 13A-1 to 13A-$n$ are used in the receiver circuit 1A as the first to n-th output level fixer circuits 13-1 to 13-$n$ in FIG. 3, respectively. The other circuit configuration and function are the same as those of the receiver circuit 1 of FIG. 3 and thus, the explanation about them are omitted here for the sake of simplification of description by attaching the same reference symbols as used in FIG. 3.

Since the first to n-th multilevel retainer circuits 13A-1 to 13A-$n$ are the same in configuration and function as each other, the first multilevel retainer circuit 13A-1 is mainly explained below.

Figure 7:
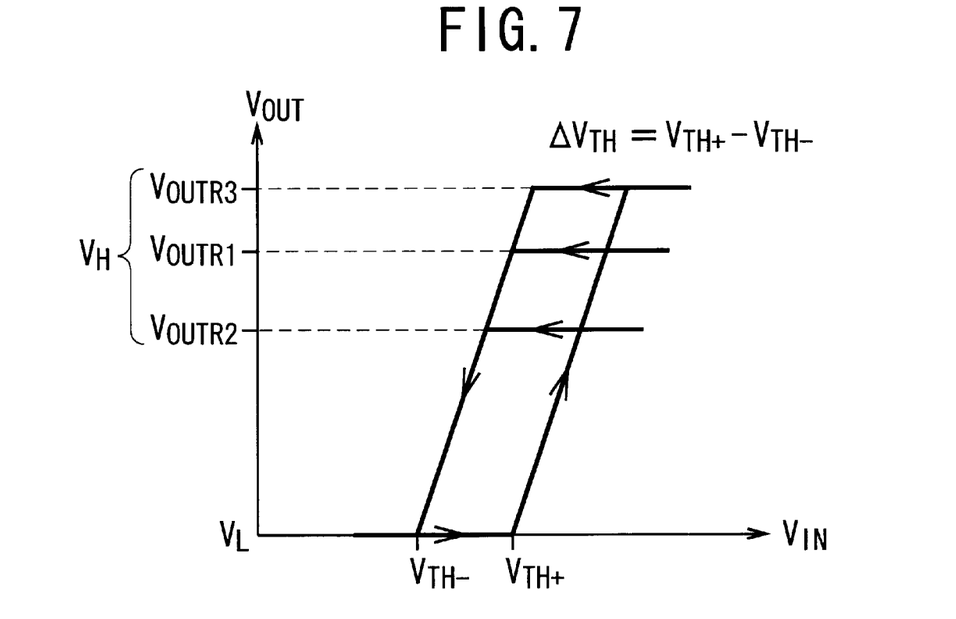
FIG. 7 is a graph showing an example of the transfer characteristic of the multilevel retainer circuit used in the receiver circuit according to the first embodiment of FIG. 5.

The first multilevel retainer circuit 13 A-1 has the input-output characteristic (i.e., the transfer characteristic) shown in FIG. 7. As seen from FIG. 7, the input-output characteristic of the circuit 13A-1 has a hysteresis, in which two threshold voltages $V_{TH+}$ and $V_{TH-}$ ($V_{TH+}>V_{TH-}>0$) for the input voltage $V_{IN}$ and three values $V_{OUTR1}$, $V_{OUTR2}$, and $V_{OUTR3}$ ($V_{OUTR3}>V_{OUTR1}>V_{OUTR2}$) for the output voltage $V_{OUT}$ are defined.

When the input voltage $V_{IN}$ increases from zero, the higher threshold voltage $V_{TH+}$ effective. Thus, if the input voltage $V_{IN}$ increases to $V_{TH+}$ or higher, one of the three output voltages $V_{OUTR1}$, $V_{OUTR2}$, and $V_{OUTR3}$ (e.g., $V_{OUTR1}$) is selectively outputted from the retainer circuit 13A-1 as the logic H voltage $V_H$ according to the setting of the circuit 13A-1, and is kept at the same level. While the input voltage $V_{IN}$ is lower than the threshold voltage $V_{TH+}$, the output voltage is kept at as the logic L voltage $V_L$.

On the other hand, when the input voltage $V_{IN}$ decreases toward zero, the lower threshold voltage $V_{TH-}$ is effective. Thus, if the input voltage $V_{IN}$ decreases to $V_{TH-}$ or lower, as the logic L voltage $V_L$ is outputted and kept unchanged. While the input voltage $V_{IN}$ is higher than the threshold voltage $V_{TH-}$, the output voltage is kept at the logic H voltage $V_H$.

With the multichannel receiver circuit 1A according to the first embodiment of FIG. 5, the multilevel retainer circuit 13A-1 for the first channel receives the first amplified input signal $S_{INA1}$. Then, if the level of the signal $S_{INA1}$ is less than the threshold value $V_{TH-}$ or $V_{TH+}$, the output signal $S_{MR1}$ of the circuit 13A-1 is fixed at the logic L voltage $V_L$. If the level of the signal $S_{INA1}$ is equal to or greater than the threshold voltage $V_{TH-}$ or $V_{TH+}$, the output signal $S_{MR1}$ of the circuit 13A-1 is fixed at the logic H voltage $V_H$ (i.e., $V_{OUTR1}$, $V_{OUTR2}$ or $V_{OUTR3}$). Thus, the waveform of the signal $S_{MR1}$ is substantially the same as that of the amplified input signal $S_{INA1}$ received.

If the level of the first input signal $S_{IN1}$ is turned and kept to be less than the reference voltage $V_{REF}$ due to non-use of the first channel or transmission line disconnection thereof or the like, the output signal $S_{MR1}$ of the circuit 13A-1 is fixed at $V_L$ (which is not 0 V). This means that no oscillation state will occur in the first channel due to absence of the first input signal $S_{IN1}$. As a result, no crosstalk or interference occurs between the first channel and the adjoining second channel. This leads to improvement of the S/N of the signal for each channel.

Preferably, the difference $\Delta V_{TH}$ between the higher and lower threshold voltages $V_{TH+}$ and $V_{TH-}$ is changeable, which is easily realized by a known technique. It is preferred that the range of hysteresis, i.e., the difference between $V_H$ (i.e., $V_{OUTR1}$, $V_{OUTR2}$, or $V_{OUTR3}$) and $V_L$, is changeable. This is easily realized by a known technique as well. If so, there is an additional advantage that waveform formation or adjustment of the input signal $S_{IN1}$ can be carried out.

The receiver circuit 1A of the first embodiment has an additional advantage that the logic H voltage $V_H$ can be selected among $V_{OUTR1}$, $V_{OUTR2}$, and $V_{OUTR3}$.

In the known multilevel retainer circuits, it is easy to make the reference level (i.e., the reference voltage $V_{REF}$) changeable in each of the first to n-th multilevel retainer circuits 13A-1 to 13A-n.

Second Embodiment

Figure 6:
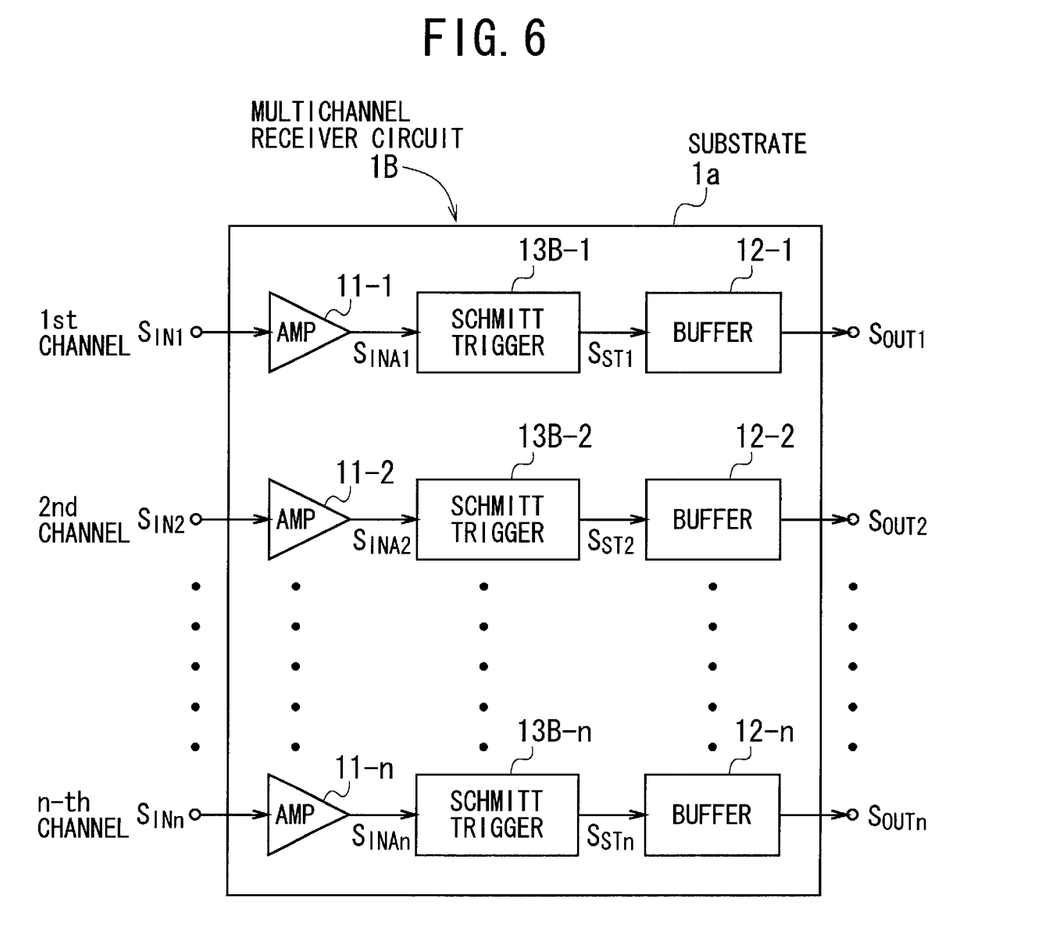
FIG. 6 is a functional block diagram showing the configuration of a multichannel receiver circuit according to a second embodiment of the invention, in which Schmitt trigger circuits are used as the output level fixer circuits.

FIG. 6 shows the configuration of a multichannel receiver circuit 1B according to a second embodiment of the invention, which corresponds to another concrete example of the receiver circuit 1 shown in FIG. 3.

As shown in FIG. 6, first to n-th Schmitt trigger circuits 13B-1 to 13B-n are used in the receiver circuit 1B as the first to n-th output level fixer circuits 13-1 to 13-n in FIG. 3, respectively. The other circuit configuration and function are the same as those of the receiver circuit 1 of FIG. 3 and thus, the explanation about them are omitted here for the sake of simplification of description by attaching the same reference symbols as used in FIG. 3.

Since the first to n-th Schmitt trigger circuits 13B-1 to 13B-n are the same in configuration and function as each other, the first Schmitt trigger circuit 13B-1 is mainly explained below.

Figure 8:
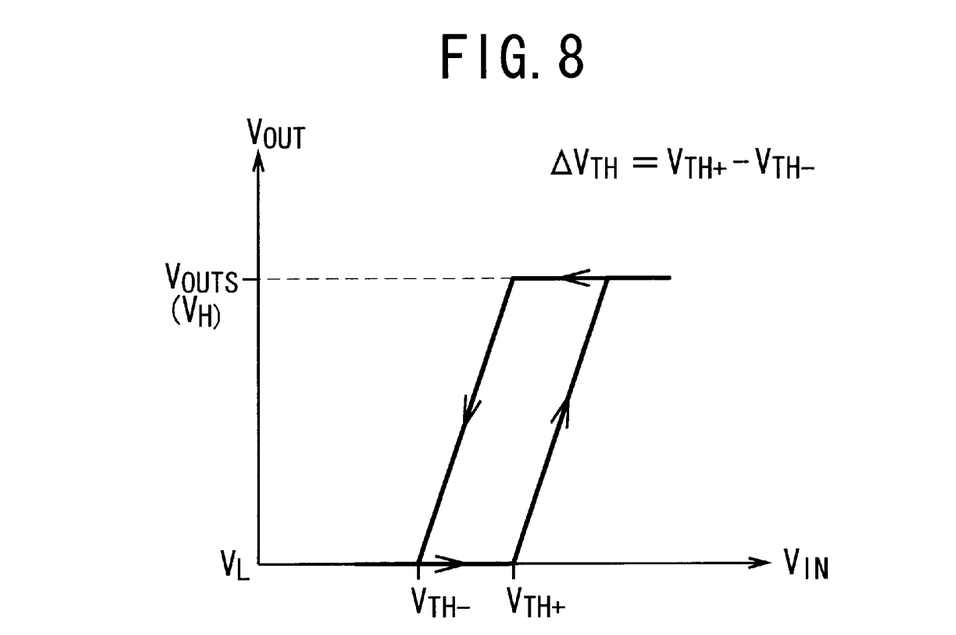
FIG. 8 is a graph showing an example of the transfer characteristic of the Schmitt trigger circuit used in the receiver circuit according to the second embodiment of FIG. 6.

The first Schmitt trigger circuit 13B-1 has the input-output characteristic (i.e., the transfer characteristic) shown in FIG. 8. As seen from FIG. 8, the input-output characteristic of the circuit 131-1 has a hysteresis, in which two threshold voltages $V_{TH+}$ and $V_{TH-}$ ($V_{TH+}>V_{TH-}>0$) and one output voltage $V_{OUTS}$ are defined.

When the input voltage $V_{IN}$ increases from zero, the higher threshold voltage $V_{TH+}$ is effective. Thus, if the input voltage $V_{IN}$ increases to $V_{TH+}$ or higher, the output voltage $V_{OUTS}$ is outputted from the Schmitt trigger circuit 13B-1 as the logic H voltage $V_H$, and is kept at the same level. While the input voltage $V_{IN}$ is lower than the threshold voltage $V_{TH+}$, the output voltage is kept at as the logic L voltage $V_L$.

On the other hand, when the input voltage $V_{IN}$ decreases toward zero, the lower threshold voltage $V_{TH-}$ is effective. Thus, if the input voltage $V_{IN}$ decreases to $V_{TH-}$ or lower, as the logic L voltage $V_L$ is outputted and kept unchanged. While the input voltage $V_{IN}$ is higher than the threshold voltage $V_{TH-}$, the output voltage is kept at the logic H voltage $V_H$.

With the multichannel receiver circuit 1B according to the second embodiment of FIG. 6, the Schmitt trigger circuit 13B-1 for the first channel receives the first amplified input signal $S_{INA1}$. Then, if the level of the signal $S_{INA1}$ is less than the threshold value $V_{TH-}$ or $V_{TH+}$, the output signal $S_{ST1}$ of the circuit 13B-1 is fixed at the logic L voltage $V_L$. If the level of the signal $S_{INA1}$ is equal to or greater than the threshold voltage $V_{TH-}$ or $V_{TH+}$, the output signal $S_{ST1}$ of the circuit 13A-1 is fixed at the logic H voltage $V_H$ (i.e., $V_{OUTS}$). Thus, the waveform of the signal $S_{ST1}$ is substantially the same as that of the amplified input signal $S_{INA1}$ received.

If the level of the first input signal $S_{IN1}$ is turned and kept to be less than the reference voltage $V_{REF}$ due to non-use of the first channel or transmission line disconnection thereof or the like, the output signal $S_{ST1}$ of the circuit 13B-1 is fixed at $V_L$ (which is not 0 V). This means that no oscillation state will occur in the first channel due to absence of the first input signal $S_{IN1}$. As a result, no crosstalk or interference occurs between the first channel and the adjoining second channel. This leads to improvement of the S/N of the signal for each channel.

Preferably, the difference $\Delta V_{TH}$ between the higher and lower threshold voltages $V_{TH+}$ and $V_{TH-}$ is changeable, which is easily realized by a known technique. It is preferred that the range of hysteresis, i.e., the difference between $V_H$ (i.e., $V_{OUTR1}$, $V_{OUTR2}$, or $V_{OUTR3}$) and $V_L$, is changeable. This is easily realized by a known technique as well. If so, there is an additional advantage that waveform formation or adjustment of the input signal $S_{IN1}$ can be carried out.

In the known Schmitt trigger circuits, it is easy to make the reference level (i.e., the reference voltage $V_{REF}$) changeable in each of the first to n-th Schmitt trigger circuit 13B-1 to 13B-n.

Variations

Needless to say, the invention is not limited to the above-described embodiments. Any change or modification may be added to these embodiments within the spirit of the invention. For example, any other circuit configuration than the multilevel retainer circuit and the Schmitt trigger circuit may be used if it has the same function as the output level fixer circuits 13-1, 13-2 . . . or, 13-n.

Moreover, the amplifiers 11-1 to 11-n are not always necessary for the invention. However, the invention is more advantageous if the amplifiers 11-1 to 11-n are provided.

While the preferred forms of the present invention has been described, it is to be understood that modifications will be apparent to those skilled-in the art without departing from the spirit of the invention. The scope of the present invention, therefore, is to be determined solely by the following claims.

What is claimed is:

1. A multichannel receiver circuit comprising:
   first to n-th sections for forming respectively first to n-th channels, where n is an integer greater than unity;
   the first to n-th sections receiving first to n-th electric input signals to produce first to n-th electric output signals, respectively, where each of the first to n-th output signals having different logic levels according to a corresponding one of the first to n-th input signals;
   each of the first to n-th sections including an output level fixer circuit that produces an output signal;

the output signal of the output level fixer circuit having a fixed level that induces no oscillation when a corresponding one of the first to n-th input signals has a level less than a specific reference level; and the output signal of the output level fixer circuit having substantially a same waveform as that of a corresponding one of the first to n-th input signals when a corresponding one of the first to n-th input signals has a level equal to or greater than the specific reference level.

2. The circuit according to claim 1, wherein each of the first to n-th sections includes an amplifier circuit located prior to the level fixer circuit;

and wherein an amplified input signal of the amplifier circuit is inputted into the level fixer circuit of a corresponding one of the first to n-th sections.

3. The circuit according to claim 1, wherein the level fixer circuit has an input-output characteristic with a hysteresis.

4. The circuit according to claim 3, wherein the hysteresis has a changeable width.

5. The circuit according to claim 1, wherein the fixed level of the output signal of the level fixer circuit is equal to a logic a L level or a logic H level.

6. The circuit according to claim 1, wherein the level-fixed output signal produced by the output level fixer circuit is equal to an intermediate level between the logic L level and the logic H level.

7. The circuit according to claim 1, wherein the reference level is changeable.

8. The circuit according to claim 1, wherein if the output signal of the level fixer circuit is in a logic L level at a time when a corresponding one of the first to n-th input signals has a level less than a specific reference level, the fixed level of the output signal of the level fixer circuit is equal to the logic L level;

and wherein if the output signal of the level fixer circuit is in a logic H level at the said time, the fixed level of the output signal of the level fixer circuit is equal to the logic H level.

9. The circuit according to claim 1, wherein the level fixer circuit is formed by a multilevel retainer circuit;

and wherein the output signal of the multilevel retainer circuit has at least two different values for the logic L or H level, one of the at least two different values being selectively used.

10. The circuit according to claim 1, wherein the level fixer circuit is formed by a Schmitt trigger circuit.

11. The circuit according to claim 1, wherein all the first to n-th sections are located monolithically on a substrate in the form of an IC.

* * * * *